(12) United States Patent
Kim

(10) Patent No.: US 7,709,393 B2
(45) Date of Patent: May 4, 2010

(54) METHOD FOR MANUFACTURING SEMICONDUCTOR DEVICE

(75) Inventor: In Su Kim, Suwon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 686 days.

(21) Appl. No.: 11/611,909

(22) Filed: Dec. 18, 2006

(65) Prior Publication Data

US 2007/0148913 A1 Jun. 28, 2007

(30) Foreign Application Priority Data

Dec. 28, 2005 (KR) ...................... 10-2005-0132296

(51) Int. Cl.
*H01L 21/302* (2006.01)
*H01L 21/461* (2006.01)

(52) U.S. Cl. ................ 438/706; 438/707; 438/714; 438/720; 438/723; 438/724; 438/745; 438/754; 438/756; 438/757

(58) Field of Classification Search ........................ None
See application file for complete search history.

(56) References Cited

U.S. PATENT DOCUMENTS 6,004,631 A * 12/1999 Mori ........................... 427/534
6,709,875 B2 * 3/2004 Gilbert et al. .................. 438/3
6,924,236 B2 * 8/2005 Yano et al. .................. 438/692

FOREIGN PATENT DOCUMENTS

KR 10-1999-0015471 3/1999
KR 10-2001-0026189 4/2001

OTHER PUBLICATIONS

Wolf et al., Silicon Processing for the VLSI Era, vol. 1, 1986, p. 429.*

* cited by examiner

*Primary Examiner*—Duy-Vu N Deo
(74) *Attorney, Agent, or Firm*—Saliwanchik, Lloyd & Saliwanchik

(57) ABSTRACT

A method for manufacturing a semiconductor device is provided. In particular, a method for removing unwanted material layers from an edge and lower bevel region of a wafer is provided. The method includes performing a first etch of an edge region of a wafer having material layers formed thereon, coating the wafer with a photoresist layer, and patterning the photoresist layer to expose at least the edge and an upper bevel region of the wafer for etching the material layers remaining after performing the first etch.

8 Claims, 3 Drawing Sheets

METHOD FOR MANUFACTURING SEMICONDUCTOR DEVICE

RELATED APPLICATION(S)

This application claims the benefit under 35 USC §119(e) of Korean Patent Application No. 10-2005-0132296 filed Dec. 28, 2005, which is incorporated herein by reference in its entirety.

FIELD OF THE INVENTION

The present invention relates to a method for manufacturing a semiconductor device.

BACKGROUND OF THE INVENTION

The manufacturing process of a semiconductor integrated circuit typically includes a series of processes for depositing conductive layers and insulating layers on the entire surface of a semiconductor wafer and patterning the material layers forming each layer to realize the semiconductor integrated circuit as designed.

In general, a semiconductor integrated circuit includes a plurality of units of semiconductor chips formed by carrying out the same processes in the same steps with respect to the plurality of semiconductor chips on the semiconductor wafer. Thus, after forming an uppermost material layer on each semiconductor chip unit, the semiconductor wafer is diced into the semiconductor chips and end parts thereof are discarded as unnecessary portions.

Because the manufacturing process for the semiconductor device is typically carried out relative to the entire surface of a semiconductor wafer, the material layers tend to form on the edge of the semiconductor wafer. However, the edge of the semiconductor wafer is an imperfect region in terms of crystallization, energy distribution, and mechanical strength, so the edge of the semiconductor wafer causes various defects in the process of forming the semiconductor integrated circuit.

That is, as semiconductor integrated circuits have become highly integrated, material layers accumulated on the edge and the bevel region of the wafer may cause various types of defects, such as expansion due to a thermal budget derived from, for example, deposition of a subsequent material layer, a lifting of a material layer, an incomplete removal of a material layer caused by a difference of selectivity between layers relative to a chemical used in dry etching or wet etching, and polymer residue. Such defects may generate particles, which penetrate into a semiconductor chip region in the process of manufacturing the semiconductor integrated circuit, thereby causing defects of the semiconductor integrated circuit.

Therefore, the material layers formed on an edge of the wafer have to be periodically removed therefrom during the manufacturing process for the semiconductor integrated circuit.

FIGS. 1 and 2 show a conventional method for processing a wafer edge.

Referring to FIG. 1, a tungsten silicide layer or a tungsten layer 61, a silicon nitride layer 62 and a silicon oxide layer 63 are formed on an edge of a wafer 60 in a process of manufacturing a semiconductor integrated circuit.

In order to remove such unnecessary material layers formed on the edge of the wafer 60, in a conventional process, a photoresist layer 64 is coated on the entire surface of the wafer 60 including a semiconductor chip region (not shown) and then a pattern of the photoresist layer 64 having a regular width is formed from the edge of the wafer 60 through a photo process.

Referring to FIG. 2, the silicon oxide layer 63 exposed at the edge and a rear side of the wafer 60 is removed by a wet chemical etch using the photoresist layer 64 as a mask. Then, the photoresist layer 64 is removed by ashing and stripping processes.

After that, the exposed silicon nitride layer 62 is removed by using an appropriate chemical while employing the silicon oxide layer 63 as a mask. Subsequently, the exposed tungsten silicide layer or tungsten layer 61 is removed.

However, the conventional method does not completely remove the silicon oxide layer 63 from the edge and a lower region of the wafer 60. Instead, the residue of the silicon oxide layer 63 may remain on the edge and the lower region of the wafer 60.

Therefore, it is necessary to ensure that the silicon oxide layer or other material layers remaining on the edge and the lower region of the wafer are removed.

BRIEF SUMMARY

Accordingly, an object of the present invention to provide a method for completely removing material layers formed on an edge and a bevel region of a wafer.

In accordance with one aspect of the present invention, there is provided a method for manufacturing a semiconductor device, the method comprising the steps of: performing a first etch of material layers formed on a wafer with respect to an edge region and a lower bevel region of the wafer; coating a photoresist layer on the material layers on the wafer; and patterning the photoresist layer to expose at least the edge region and the lower bevel region of the wafer, wherein at least a portion of the material layers formed on the edge region and the lower bevel region of the wafer is removed before forming the photoresist layer.

DETAILED DESCRIPTION OF THE INVENTION

Hereinafter, a manufacturing process for a semiconductor device in accordance with embodiments of the present invention will be described in detail with reference to the accompanying drawings.

Figure 1:
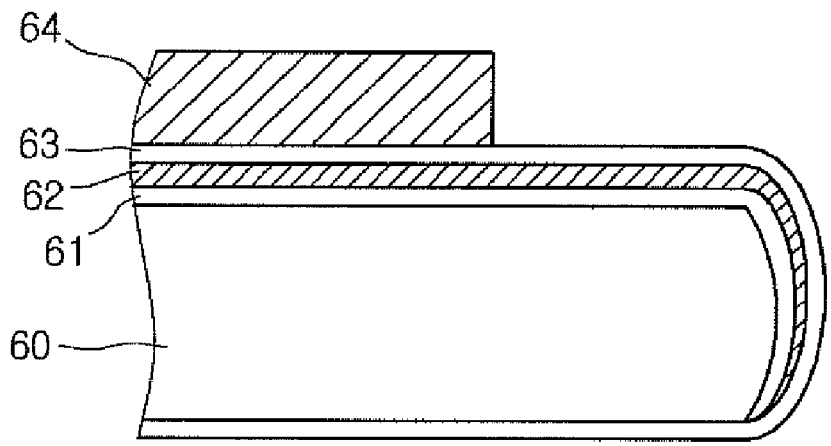
FIGS. 1 and 2 are sectional views showing a conventional method for processing a wafer edge.
Figure 2:
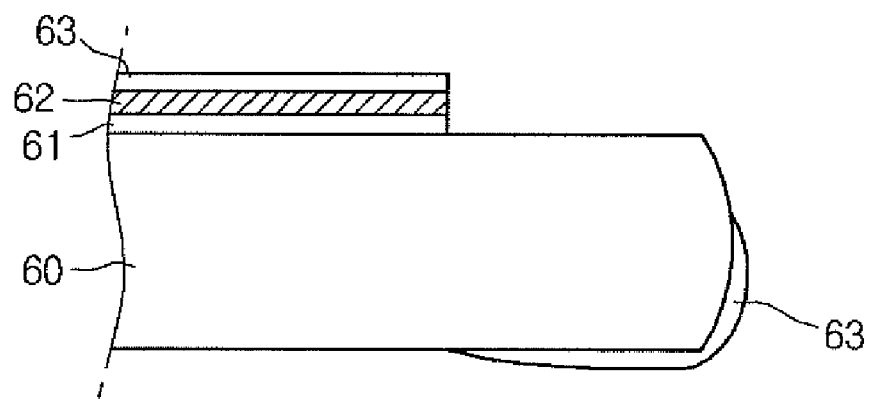
Figure 3:
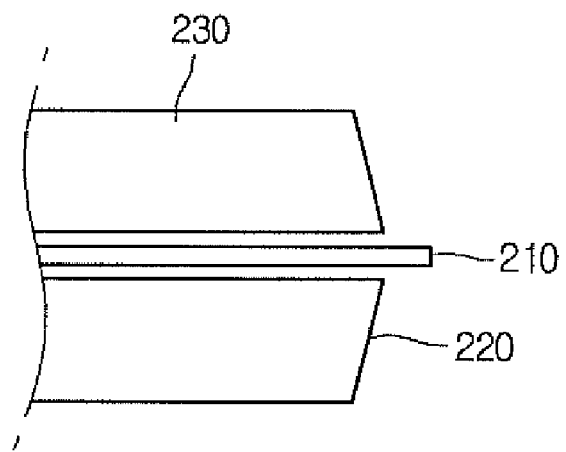
FIG. 3 is a view for schematically illustrating a method for manufacturing a semiconductor device according to an embodiment of the present invention.

FIG. 3 is a view for schematically illustrating a method for manufacturing a semiconductor device according to an embodiment of the present invention.

Referring to FIG. 3, a wafer 210 can be placed between a lower plate 220 and an upper plate 230. In one embodiment, an oxide layer formed on an edge region and a lower region of the wafer 210 can be removed by feeding a reaction gas into a chamber where the wafer 210 is interposed between the plates 220 and 230.

Material layers, such as an oxide layer, a metallic layer, etc., can be formed on the wafer 210 during previous processes. For the process for removing the material layers from an edge and lower region of the wafer using plates 220 and 230, the lower plate 220 and the upper plate 230 can be part of a plasma processing apparatus.

When a wafer 210 is placed between the lower plate 220 and the upper plate 230, the plates 220 and 230 can make close contact with a portion of the wafer 210 to prevent penetration of the reaction gas at the contacted portion of the wafer. Therefore, the plates 220 and 230 can prevent a portion of the wafer 210 from reacting with the plasma.

Therefore, a portion of the oxide layer exposed to the reaction gas can be removed from the edge region and lower region of the wafer 210. Thus, according to embodiments of the present invention, an etching process can be selectively carried out with respect to a bevel region of the wafer 210.

In a further embodiment, the above described processes can be repeatedly carried out for a wafer including a metallic material such as an aluminum material formed on the edge region and the lower region of the wafer 210 in addition to the oxide layer.

According to one embodiment of the subject invention, the metallic material and the oxide layer formed on the edge region and the lower region of the wafer 210 can be simultaneously removed.

In a specific embodiment, dry etching process may be carried out in the plasma processing apparatus under the conditions of 1 to 2 Torr, 400 to 900 Watt, 50 to 150 SCCM $SF_6$, 50 to 200 SCCM $CF_4$, and 5 to 30 SCCM $O_2$.

By removing impurities existing on the edge and the lower region (the bevel region) of the wafer 210, it may be possible to prevent characteristics of the semiconductor device from being affected by particles in subsequent processes.

Figure 4:
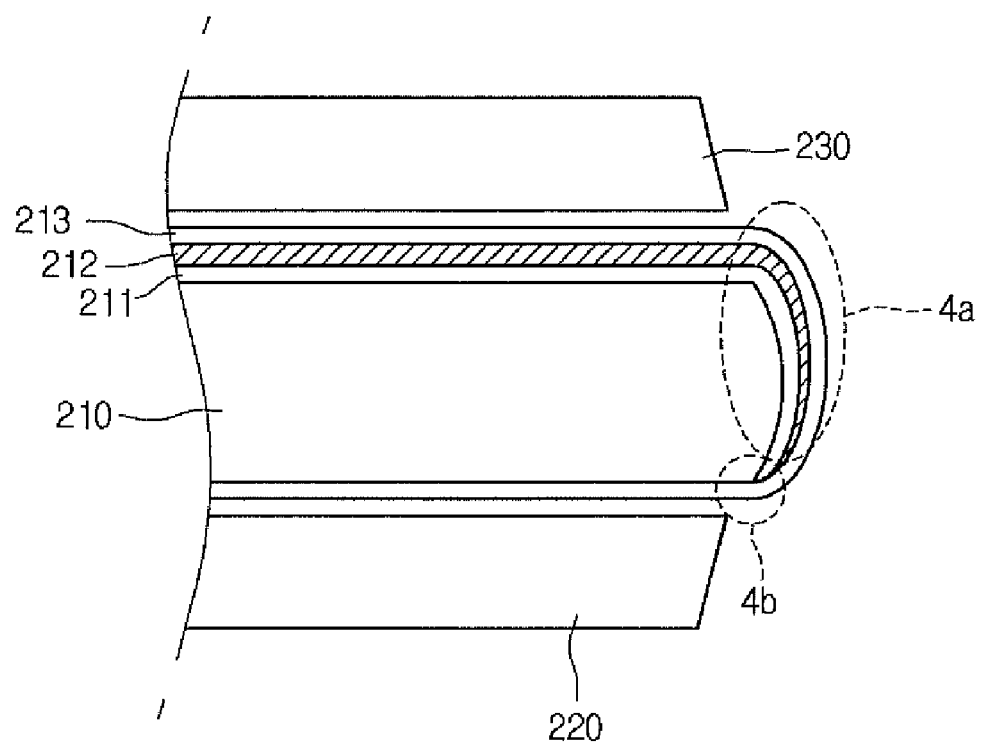
FIGS. 4 to 6 are sectional views illustrating a method for manufacturing a semiconductor device according to an embodiment of the present invention.
Figure 5:
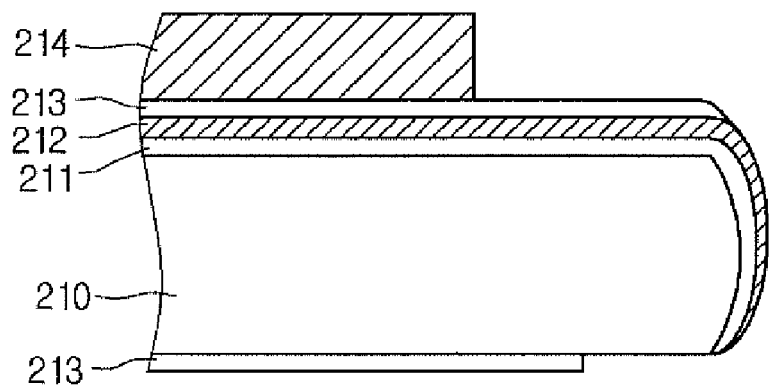
Figure 6:
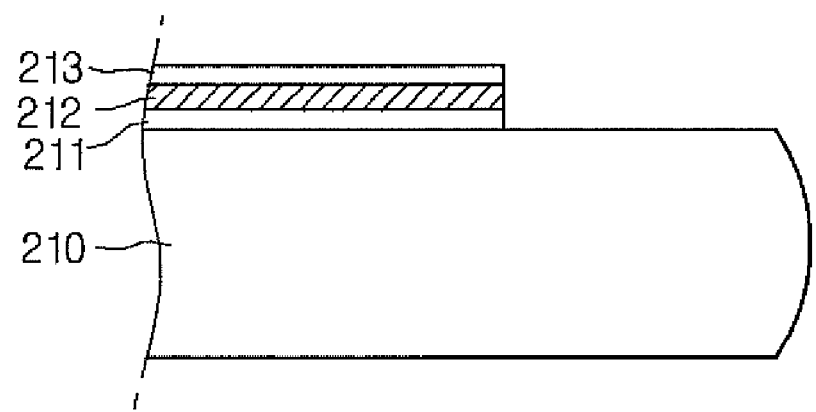

FIGS. 4 to 6 are sectional views illustrating a method for manufacturing a semiconductor device according to an embodiment of the present invention.

In FIGS. 4 to 6, a cross section of the wafer 210 is shown. In particular, FIG. 4 shows an edge region 4a and a lower bevel region 4b of the wafer 210.

Referring to FIG. 4, in one method of manufacturing a semiconductor device, a metallic layer 211, a nitride layer 212 and an oxide layer 213 can be sequentially deposited on a wafer 210.

During the process steps for depositing the metallic layer 211, the nitride layer 212 and the oxide layer 213, these material layers 211, 212, and 213 can also form on the edge region 4a of the wafer. In addition, the oxide layer 213 can also form on the lower region of the wafer including the lower bevel region 4b.

To remove unwanted portions of the material layers, such as material layers 211, 212, and 213, the wafer 210 can be interposed between an upper plate 230 and a lower plate 220 before a step of forming a photoresist pattern for exposing the end region of the wafer. The upper plate 230 and the lower plate 220 can be installed as a part of a plasma processing apparatus.

In a specific embodiment, the wafer 210 can make close contact with the upper plate 230 and the lower plate 220 while exposing the edge region 4a and the lower bevel region 4b of the wafer 210.

Thereafter, $SF_6$, $CF_4$ and $O_2$ gases can be injected into the plasma processing apparatus. These injected gases can make contact with the exposed edge region 4a and the lower bevel region 4b of the wafer 210 to perform an etch of the exposed regions.

In one embodiment, the dry etching may be carried out in the plasma processing apparatus under the conditions of 1 to 2 Torr, 400 to 900 Watt, 50 to 150 SCCM $SF_6$, 50 to 200 SCCM $CF_4$, and 5 to 30 SCCM $O_2$.

According to embodiments, the injected gases do not reach a predetermined portion of the wafer 210 that makes close contact with the upper plate 230 and the lower plate 220, but the injected gases do make contact with the exposed edge region 4a and the lower bevel region 4b of the wafer 210.

Referring to FIG. 5, by the dry etching in the plasma processing apparatus, the oxide layer 213 formed on the edge region 4a and the lower bevel region 4b of the wafer 210 can be removed.

Then, a photoresist layer 214 can be formed and patterned on the wafer 210 such that an end region including the edge region 4a of the wafer 210 is exposed.

Referring to FIG. 6, the oxide layer 213, the nitride layer 212 and the metallic layer 211 can be etched using the photoresist layer 214 as an etch mask.

The etching process using the photoresist layer 214 as the mask may include a wet etching process. In addition, because the oxide layer 213 can be removed from the edge region 4a and the lower bevel region 4b of the wafer 210 in a first etch step, the material layers including the oxide layer will not be left remaining on the edge region 4a and the lower bevel region 4b of the wafer 210.

In a specific embodiment, the wet etching process may be carried out under the conditions of 55° C., HF 49% to 55%, and 500 to 1000 RPM.

It should be understood that the examples and embodiments described herein are for illustrative purposes only and that various modifications or changes in light thereof will be suggested to persons skilled in the art and are to be included within the spirit and purview of this application.

I claim:

1. A method for manufacturing a semiconductor device, the method comprising:
   forming material layers on a wafer;
   performing a first etch to remove a portion of the material layers formed on the edge region and the lower bevel region of the wafer; and
   forming a photoresist layer on the material layers and patterning the photoresist layer to expose at least the edge region and the lower bevel region of the wafer,
   wherein the portion of the material layers formed on the edge region and the lower bevel region of the wafer is removed by performing the first etch before forming the photoresist layer,
   wherein performing the first etch comprises:
      interposing the wafer between a first plate and a second plate, wherein the first plate and the second plate contact the wafer while exposing the edge region and the lower bevel region of the wafer, and
      exposing the material layers formed on the edge region and the lower bevel region of the wafer to $SF_6$, $CF_4$ and $O_2$ gases to remove the portion of the material layers.

2. The method as defined in claim 1, wherein exposing the material layers formed on the edge region and the lower bevel region of the wafer is performed under conditions of 1 to 2 Torr, 400 to 900 Watt, 50 to 150 SCCM $SF_6$, 50 to 200 SCCM $CF_4$, and 5 to 30 SCCM $O_2$.

3. The method as defined in claim 1, wherein the portion of the material layers formed on the edge region and the lower bevel region of the wafer comprises an oxide layer.

4. The method as defined in claim 1, further comprising performing a wet etching process using the patterned photoresist layer as a mask, wherein the wet etching process is performed under conditions of 55° C., HF 49% to 55%, and 500 to 1000 RPM.

5. The method as defined in claim 1, wherein the material layers formed on the wafer comprise a metallic layer, a nitride layer, and an oxide layer.

6. A method for manufacturing a semiconductor device, the method comprising:
   forming material layers on a wafer;
   performing a first etch to remove a portion of the material layers formed on the edge region and the lower bevel region of the wafer;
   forming a photoresist layer on the material layers and patterning the photoresist layer to expose at least the edge region and the lower bevel region of the wafer; and
   performing a wet etching process using the patterned photoresist layer as a mask, wherein the wet etching process is performed under conditions of 55° C., HF 49% to 55%, and 500 to 1000 RPM,
   wherein the portion of the material layers formed on the edge region and the lower bevel region of the wafer is removed by performing the first etch before forming the photoresist layer.

7. The method as defined in claim 6, wherein the portion of the material layers formed on the edge region and the lower bevel region of the wafer comprises an oxide layer.

8. The method as defined in claim 6, wherein the material layers formed on the wafer comprise a metallic layer, a nitride layer, and an oxide layer.

* * * * *